(12) United States Patent
Velez et al.

(10) Patent No.: US 6,278,746 B1
(45) Date of Patent: Aug. 21, 2001

(54) TIMING RECOVERY LOOP CIRCUIT IN A RECEIVER OF A MODEM

(75) Inventors: Edgar Velez, Kanata; Ian Dublin, Ottawa, both of (CA)

(73) Assignee: Montreal Networks Limited, Montreal (CA)

(*) Notice: Subject to any disclaimer, the term of this patent is extended or adjusted under 35 U.S.C. 154(b) by 0 days.

(21) Appl. No.: 09/076,240

(22) Filed: May 12, 1998

(51) Int. Cl.[7] .............. H04L 27/22; H03D 3/18; H03D 3/00; H03L 7/00
(52) U.S. Cl. .......... 375/326; 375/327; 375/344; 329/306; 329/307; 331/18
(58) Field of Search ................... 375/326, 327, 375/343, 344, 345, 355, 371–373, 376, 329, 332, 279, 280, 281, 222, 223, 143, 152, 350, 319; 331/1 R, 1 A, 17, 18, 25; 327/156, 159, 162, 163, 2; 455/255, 257, 259, 260; 329/304, 306, 307; 713/400; 708/300

(56) References Cited

U.S. PATENT DOCUMENTS

| | | | |
|---|---|---|---|
| 5,388,127 | 2/1995 | Scarpa | 375/376 |
| 5,517,526 | 5/1996 | Caudron et al. | 375/355 |
| 5,550,869 | * 8/1996 | Gurantz et al. | 375/340 |
| 5,703,905 | 12/1997 | Langberg | 375/327 |
| 5,790,600 | * 8/1998 | Marchesani et al. | 375/259 |
| 5,835,544 | * 11/1998 | Yoshimura et al. | 375/376 |
| 5,878,088 | * 3/1999 | Knutson et al. | 375/324 |
| 5,969,570 | * 10/1999 | Unkrich et al. | 329/304 |
| 5,987,073 | * 11/1999 | Knutson | 375/326 |
| 6,018,556 | * 1/2000 | Janesch et al. | 375/376 |

* cited by examiner

*Primary Examiner*—Stephen Chin
*Assistant Examiner*—Betsy L. Deppe
(74) *Attorney, Agent, or Firm*—Max R. Wood; Swabey Ogilvy Renault

(57) ABSTRACT

A method and apparatus for timing recovery in modem receivers. The timing recovery circuit includes a voltage controlled oscillator for controlling the voltage controlled sampling frequency of an analog-to-digital converter. The oscillator generates a timing clock that is dependent on an average phase error signal calculated from Nyquist signals of the input signal. A phase detector circuit is used for generating an instantaneous phase error signal of the in-phase and quadrature-phase signals. A digital loop filter receives the instantaneous phase error signal over time to generate the average phase error signal. The average phase error signal is conditioned further (after conversion to analog) by an analog loop filter such that the average phase error signal adjusts the timing clock generated by the oscillator. The low pass filter provides control of the acquisition and steady state operations by changing the gain and pole parameters of the filter. This control enables fast timing acquisition and low noise with reduced phase jitter during steady state operation.

24 Claims, 5 Drawing Sheets

TIMING RECOVERY LOOP CIRCUIT IN A RECEIVER OF A MODEM

FIELD OF THE INVENTION

This invention relates to the field of timing recovery in modems and in particular to a timing recovery loop circuit in a receiver of a modem.

BACKGROUND OF THE INVENTION

In communication systems a modem is used to convert (modulate) digital signals generated by a computer into analog signals suitable for transmission over telephone lines. Another modem, located at the receiving end of the transmission, converts (demodulates) the analog signals back into digital form. Timing recovery refers to, and includes, the generation and/or reconstruction of a clock signal, at a receiver, to sample the incoming signal. The clock signal generated at the receiver end must agree in frequency with the transmitter clock at the sending end and may also require proper phasing.

To recover data from a Quadrature Amplitude Modulated (QAM) signal (for example), a receiver is required to convert the analog signal received into a digital signal and to distinguish between the individual symbols that comprise the signal bitstream. Symbol timing recovery is used to recover a clock signal at the symbol rate, or a multiple of the symbol rate, from the modulated waveform that is received. This clock signal may be used by the receiver to convert the continuous-time received signal into a discrete-time sequence of data symbols.

Traditional recovery circuits are typically functionally limited to a small operating range. When the signal loss and distortion vary over a large dynamic range, the behaviour of the circuit changes dramatically due to the large variability in the circuit's s-curve maximum amplitude for different channels.

An s-curve is a curve showing the output of a phase detector in a timing recovery circuit as the phase difference between a received signal phase and an ideal phase between 0 and $2\pi$. The amplitude of the s-curve can be viewed as a measure of the quality of the timing recovery. In particular, robust and accurate timing recovery in a modem receiver generates a large maximum amplitude of the s-curve. If the s-curve maximum amplitude is reduced (due to loss, distortion, etc.), it results in long acquisition times and large phase jitter after acquisition. This problem is accentuated by the use of various QAM constellations, slope equalizer settings, and by the presence of radio frequency interference (RFI) from commercial AM broadcasts.

In general, traditional timing recovery, in modem receivers is based on standard phase-locked loop (PLL) circuitry (i.e. phase detector, loop filter, and oscillator). Some systems use the output of a timing tone circuit as an input signal. The timing tone circuit derives a tone from the incoming signal having a frequency that is equal to the symbol rate. Further, typical phase detectors are based on decisions about the received signal.

SUMMARY OF THE INVENTION

An object of the present invention is to provide a timing recovery loop circuit that operates for a relatively large range of bandwidths and QAM orders.

Another object of the present invention is to provide a timing recovery loop circuit that provides flexibility in establishing fast acquisition times and reduced phase jitter after acquisition.

In accordance with an aspect of the present invention there is provided a receiver circuit having means for receiving and sampling an analog input signal to generate a digital signal controlled by a voltage controlled oscillator supplying a timing signal; said receiver circuit comprising: a digital matched filter for filtering the digital signal to generate an in-phase signal and a quadrature-phase signal; a phase detector for generating an instantaneous phase error signal based on the in-phase and a quadrature-phase signals; and filtering means for averaging the instantaneous phase error signal over time to generate an average phase error signal for adjusting the timing signal supplied by the oscillator to the means for receiving and sampling the analog input signal.

In accordance with another aspect of the present invention there is provided a symbol timing recovery circuit, comprising: a voltage controlled oscillator for generating a timing signal as a function of an average phase error signal; an analog-to-digital converter for generating a digital signal from an input analog signal based on the timing signal; a digital matched filter for filtering the digital signal to generate an in-phase signal and a quadrature-phase signal; a phase detector circuit for generating an instantaneous phase error signal of the in-phase and quadrature-phase signals; a digital loop filter for receiving the instantaneous phase error signal over time to generate the average phase error signal; a digital-to-analog converter for converting the average phase error signal into analog; and an analog loop filter for receiving and conditioning the average phase error signal from the digital loop filter converted by the digital-to-analog converter, wherein the average phase error signal adjusts the timing signal generated by the oscillator.

In accordance with another aspect of the present invention there is provided a symbol timing recovery circuit, comprising: a voltage controlled oscillator for generating a sampling clock as a function of an average phase error signal; the oscillator having a nominal frequency and an output for outputting the sampling clock; an analog-to-digital converter for generating a digital signal from an input analog signal; said analog-to-digital converter having an output for outputting the digital signal, an analog signal input for receiving the input analog signal, and a sampling frequency control signal input coupled to the output of the oscillator for receiving the timing signal and for controlling the rate at which the analog-to-digital converter samples the analog signal; a digital matched filter for filtering the digital signal to generate an in-phase signal and a quadrature-phase signal; the digital matched filter includes an input coupled to the digital signal output of the analog-to-digital converter for receiving the digital signal, and a first output for outputting the in-phase signal and a second output for outputting the quadrature-phase signal; a phase detector circuit for generating an instantaneous phase error signal of the in-phase and quadrature-phase signals; a digital loop filter for receiving the instantaneous phase error signal over time to generate the average phase error signal; a digital-to-analog converter for converting the average phase error signal into analog; and an analog loop filter for receiving and conditioning the average phase error signal from the digital loop filter converted by the digital-to-analog converter, wherein the average phase error signal adjusts the nominal frequency of the oscillator to output the sampling clock.

In accordance with another aspect of the present invention there is provided a method of generating a symbol timing signal from an analog signal, the method comprising the steps of: operating a voltage controlled oscillator in response to an average phase error signal to generate a timing signal having a sampling frequency fs; operating an analog-todigital converter to receive the analog signal, to receive the timing signal, and to generate a digital signal by sampling the analog signal at the frequency fs; filtering the digital signal to generate an in-phase signal and a-quadrature-phase signal; sampling the in-phase signal to generate an in-phase error signal; sampling the quadrature-phase signal to generate a quadrature-phase error signal; summing the in-phase error signal and the quadrature-phase error signal to obtain an instantaneous phase error signal; and filtering the instantaneous phase error signal over a prescribed period of time to obtain the average phase error signal.

In accordance with another aspect of the present invention there is provided a method of obtaining and maintaining timing lock in a modem receiver comprising: initializing a digital loop filter having a gain parameter and a frequency pole parameter, where the gain parameter is assigned a prescribed value and the frequency pole parameter is assigned a prescribed value; waiting a prescribed amount of time for timing lock; and modifying the parameters of the digital loop filter by increasing the prescribed value of the gain parameter and by increasing the prescribed value of the frequency pole parameter.

BRIEF DESCRIPTION OF THE DRAWINGS

The present invention will be described in conjunction with the drawings in which.

DETAILED DESCRIPTION OF EMBODIMENTS OF THE INVENTION

Figure 1:
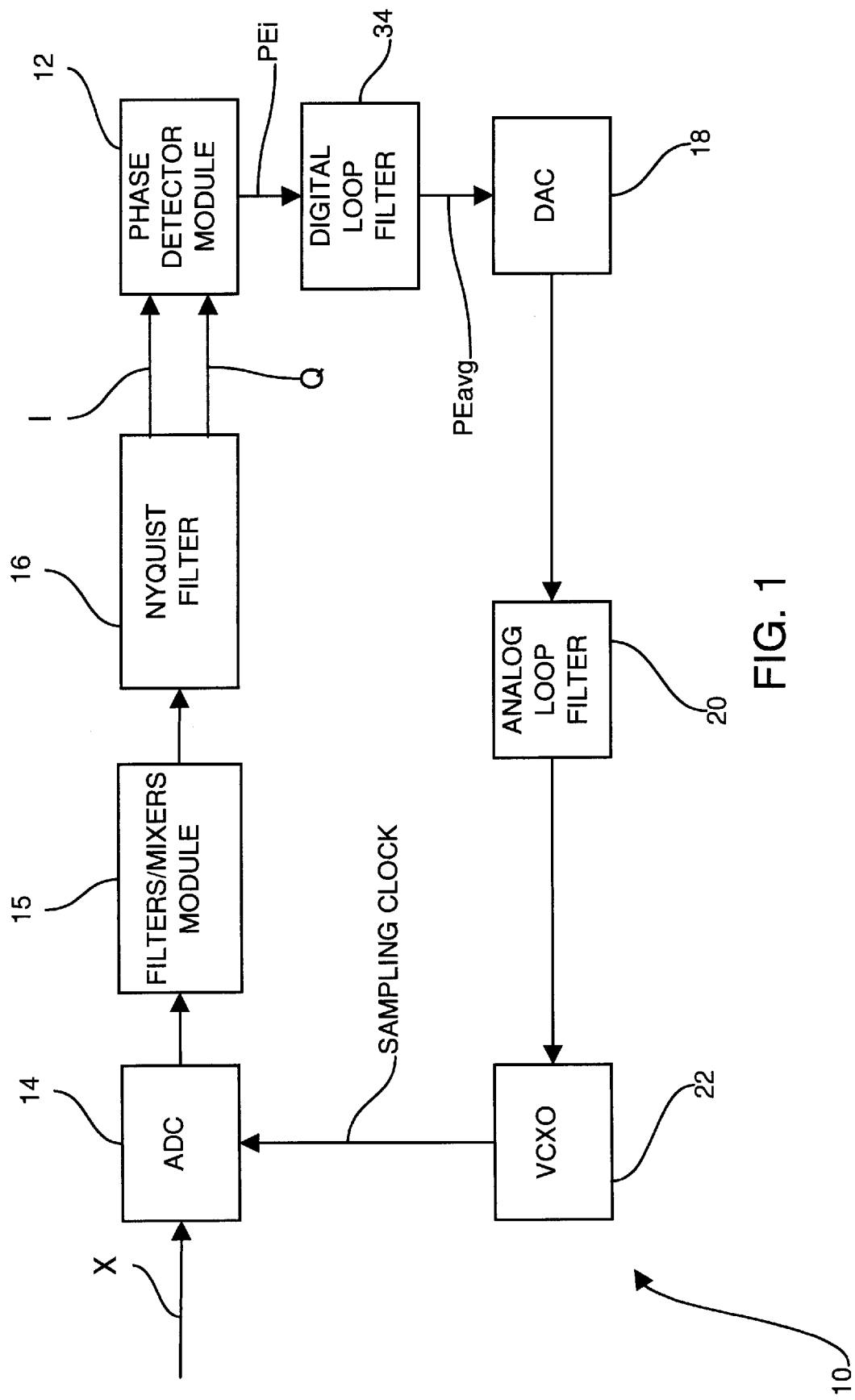
FIG. 1 illustrates a block diagram of a timing recovery loop circuit of a receiver a modem that incorporates timing recovery according to one embodiment of the present invention.

FIG. 1 illustrates the main components of a timing recovery loop circuit 10 of a modem receiver incorporating timing recovery in accordance with one embodiment of the present invention. The timing recovery loop circuit 10 includes an analog-to-digital converter (ADC) 14 to convert a QAM input signal X into a digital signal that represents a real passband signal. The digital signal is processed by a filters/mixers module 15 and a Nyquist filter 16 (a digital matched filter) to demodulate the QAM signal from a passband spectrum to a baseband spectrum, which is composed of real and imaginary components (i.e. an in-phase (I) signal and a quadrature-phase signal (Q)).

The I and Q signal components of the QAM signal are processed through a phase detector module 12 to generate an instantaneous phase error PEi that is processed by a digital loop filter 34 to produce an average phase error signal PEavg. The details of the phase detector module 12 and the digital loop filter 34 are discussed below with reference to FIG. 2.

The output (PEavg signal) from the filter 34 passes to a digital-to-analog converter (DAC) 18 to generate an analog signal that is processed through an analog loop filter 20. The filter 20 is a differential first-order lead lag type to further condition the average phase error signal PEavg for timing recovery. The filter 20 also attenuates high frequency noise from the DAC 18. The output from the filter 20 is directed to a voltage controlled crystal oscillator 22 (VCXO) to adjust its frequency and phase to the correct values needed for symbol extraction (i.e. ADC sampling). The output from the VCXO 22 represents a sampling clock (also referred to as a timing signal) for the ADC 14. Further, the sampling clock output of the VCXO 22 is the clock for the receiver.

In general, having estimated the instantaneous phase error (PEi) with the phase detector module 12, the digital loop filter 34 integrates the instantaneous phase error (PEi) to produce the average phase error signal, which is further conditioned by the analog loop filter 20 after conversion by the DAC 18 to produce a signal that controls the frequency of a nominal frequency of the VCXO 22. When the VCXO 22 produces the correct frequency and phase, the timing recovery loop circuit 10 is locked.

Figure 2:
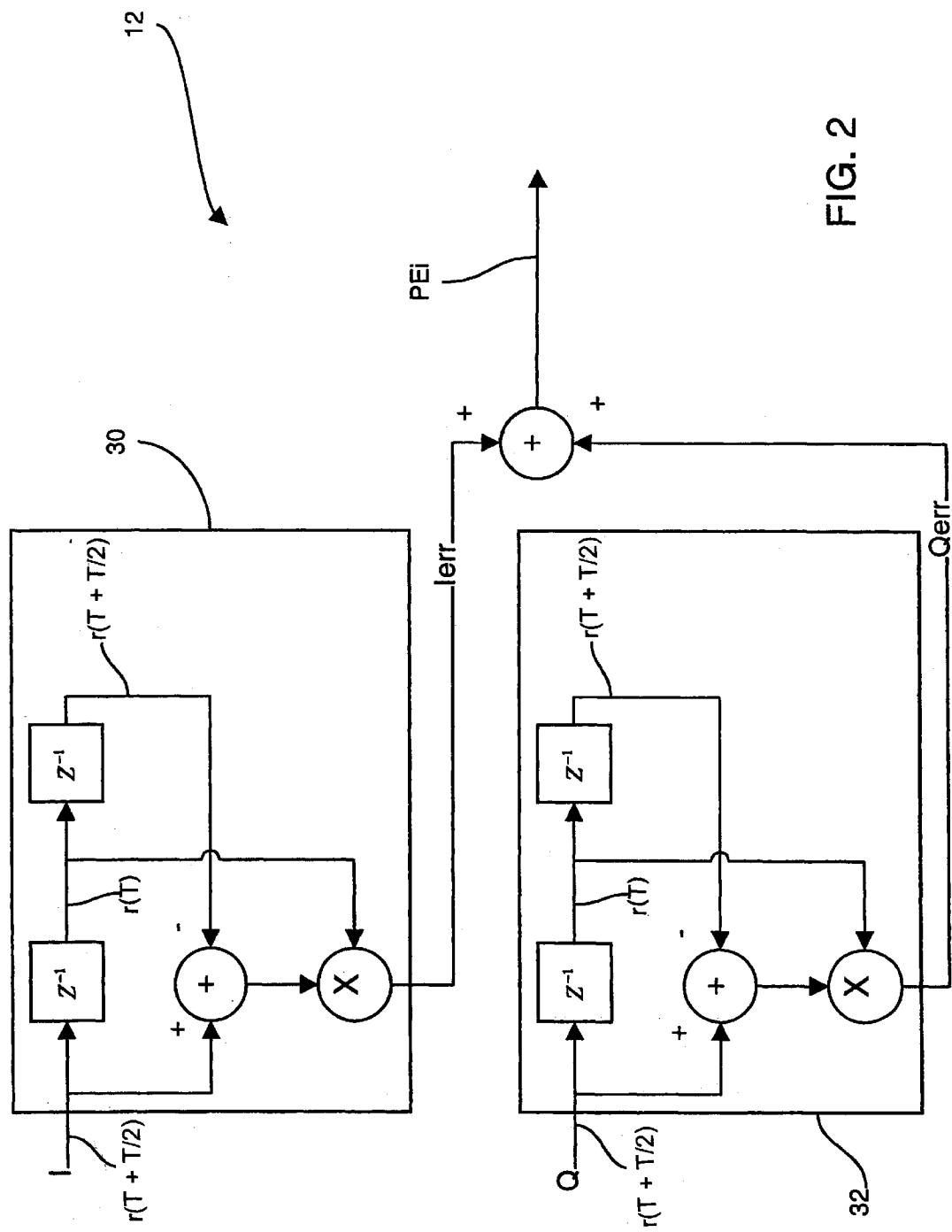
FIG. 2 illustrates a block diagram of the phase detector module of FIG. 1.

A detailed block diagram of the phase detector module 12 is provided in FIG. 2. The phase detector module 12 generates the PEi that is used as a basis for controlling the VCXO 22, and compensates for frequency drifts between a transmit oscillator and the receive oscillator 22. The frequency and phase of the receiver clock must be continually adjusted to optimize the sampling instants of the input signal X. According to the present invention, timing information is derived from the output of the Nyquist filter 16 (i.e. the I and Q signal components of the QAM input signal X). The timing recovery of the present invention is non-data directed, since it does not make use of QAM symbol decisions. In particular, timing recovery is based on the raw signal samples at the Nyquist filter 16 output sampled at twice the symbol rate as discussed in detail below.

Two phase error estimations are performed by the phase detector module 12. A phase error term (Ierr) is estimated in block 30 from the in-phase (I) samples received from the Nyquist filter 16. The phase error term (Ierr) from the in-phase samples is defined by equation Eq. 1. The $Z^{-1}$ blocks in FIG. 2 represent shifts in the received data samples r, which are sampled at twice the symbol rate, therefore $Z^{-1}$ represents half a symbol duration.

$$\text{Ierr}=[\{r_i(T+T/2)-r_i(T-T/2)\}\times r_i(T)] \qquad \text{Eq. 1}$$

where T=symbol period and $r_i$ represents complex in-phase (I) received data samples.

Another phase error term (Qerr) is estimated in block 32 from the quadrature-phase (Q) samples received from the Nyquist filter 16. The phase error term (Qerr) from the quadrature-phase samples is defined by equation Eq. 2.

$$\text{Qerr}=[\{r_q(T+T/2)-r_q(T-T/2)\}\times r_q(T)] \qquad \text{Eq. 2}$$

where T=symbol period and $r_q$ represent complex quadrature-phase (Q) received data samples.

For a single undistorted received symbol impulse, the received data points that are half a symbol before {r(T−T/2)} and half a symbol after {r(T+T/2)} the peak r(T) should be equal on average, if the timing is correct (r is used to generically represent I and Q data samples). The center point r(T) is multiplied by the difference of the two outer points (refer to Eq. 1 and Eq. 2). The resulting phase errors (Ierr and Qerr) indicate the direction in which to make an adjustment. The timing routine requires averaging (discussed below) to produce an estimated phase error signal, and works to direct the timing to the peak of a symbol impulse.

The phase error terms (Ierr and Qerr) are added together to produce the instantaneous phase error (PEi). The PEi is integrated over time by the digital loop filter 34 to produce the average phase error (PEavg).

The average phase error PEavg is used, after further filtering by the analog loop filter 20, to increase or decrease the VCXO 22 frequency and phase (simultaneously) until the average phase error PEavg is below a threshold (i.e. almost zero) at which point the timing recovery loop circuit 10 has locked, i.e. matched the frequency and phase of the VXCO 22 to the rate and phase of the received symbols.

The digital loop filter 34 is a programmable filter that permits changes to pole and gain settings as characterized by equation Eq. 3.

$$2^{-k_1} * \frac{1}{1-(1-2^{-k_2})Z^{-1}} \qquad \text{Eq. 3}$$

where $k_1$ controls loop gain of the digital loop filter 34 and $k_2$ controls frequency pole of the digital loop filter 34.

The parameters $k_1$ and $k_2$ of the digital loop filter 34 provide flexibility in timing recovery functions by adjusting acquisition and steady state operation. In particular, when the filter pole parameter $k_2$ is small (corresponding to a high frequency pole), the average phase error PEavg tends to exhibit high frequency noise and high amplitude after convergence in steady state (i.e. minimum PEavg, close to zero). When the filter pole setting $k_2$ is large (corresponding to a low frequency pole), the average phase error PEavg tends to exhibit lower frequency noise and smaller amplitude in steady state.

The two main operating conditions of the digital loop filter 34 are (1) initialization/acquisition mode: start with high frequency pole (i.e. low $k_2$) and high loop gain (i.e. low $k_1$) for fast convergence/acquisition with high phase jitter; and (2) steady state/converged mode: after convergence/acquisition switch to low frequency pole (i.e. increase $k_2$) and low loop gain (i.e. increase $k_1$), which will result in reduced phase jitter.

Figure 3:
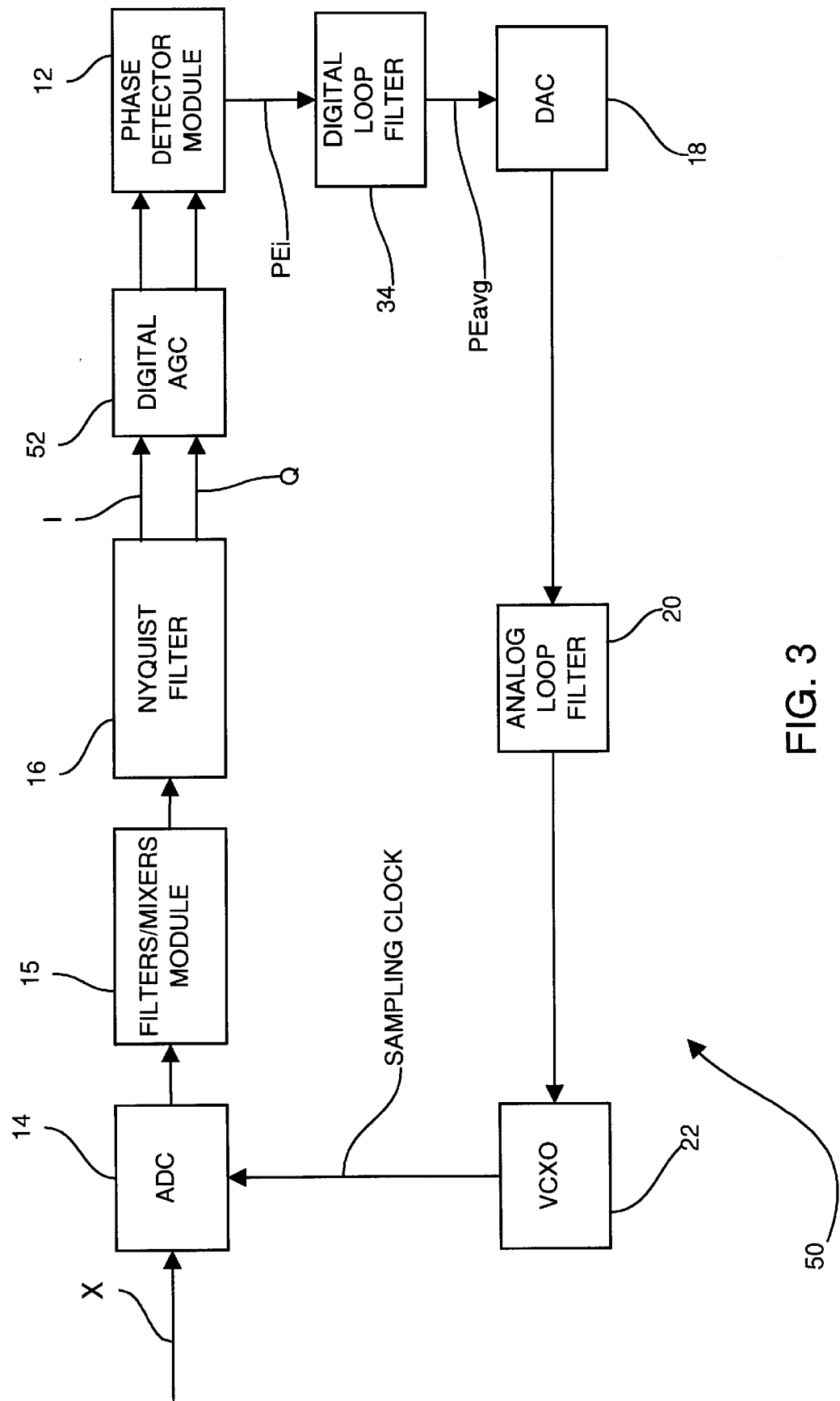
FIG. 3 illustrates a block diagram of a timing recovery loop circuit of a receiver in a modem that incorporates timing recovery according to another embodiment of the present invention.

In FIG. 3, an alternative embodiment of the present invention is illustrated in a timing recovery loop circuit 50. A digital automatic gain control amplifier (AGC) 52 is added to the circuit 10 of FIG. 1. All the other components operate in the same manner as previously discussed. The digital AGC 52 is used to compensate for a QAM signal that is potentially lower than desired (possibly as much as 20 db lower). Since large signal peaking due to out of band spectral components (such as amplitude modulation (AM) interference) are attenuated by digital filtering (through the module 15 and filter 16), the QAM signal can be much smaller after filtering. The alternative circuit 50 includes the digital AGC 52 in order to reduce dynamic range of the signal which has to be processed by the timing recovery circuit 10 and other equalization circuits (not shown).

Figure 4:
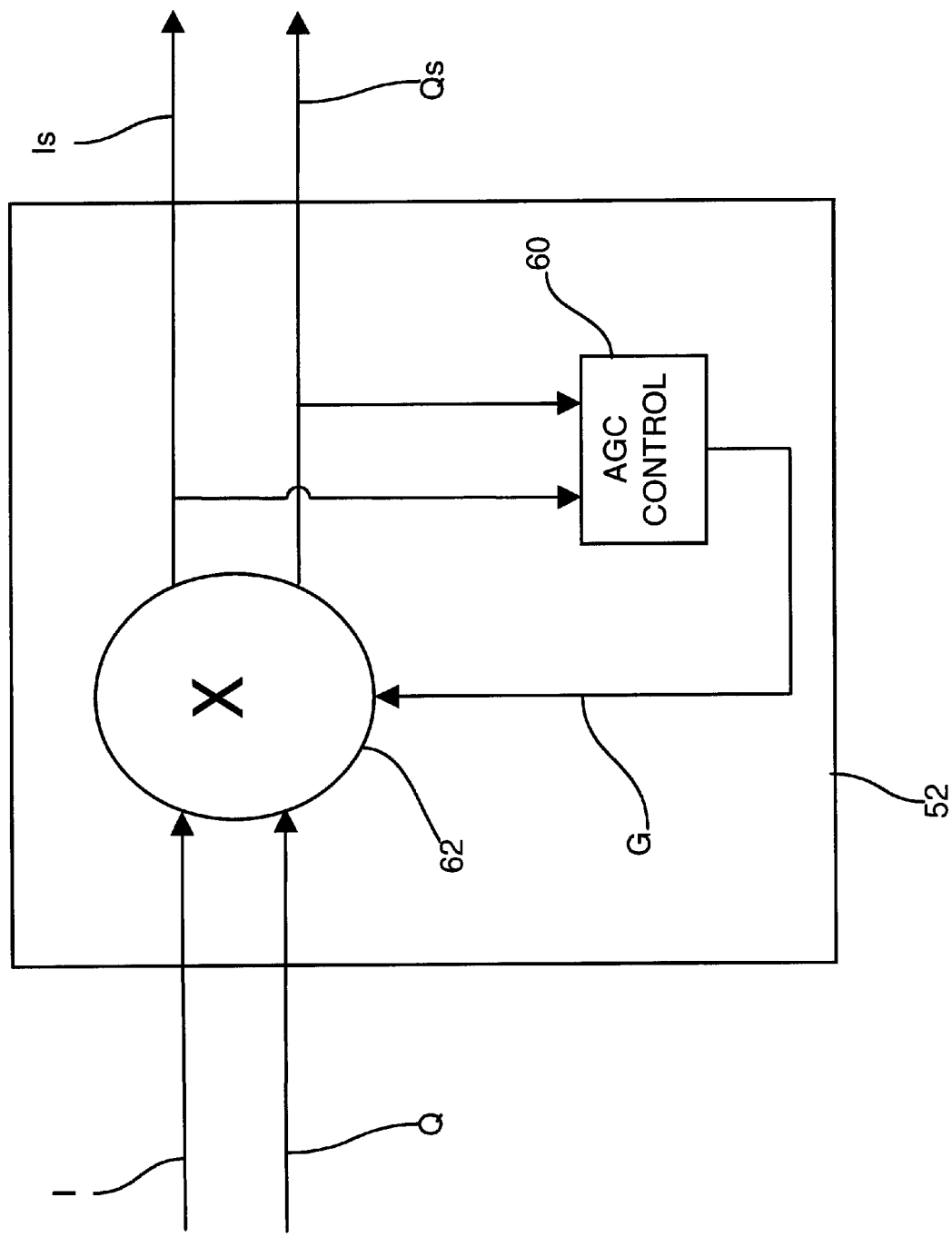
FIG. 4 illustrates a block diagram of the digital automatic gain control of FIG. 3.

A block diagram of the digital AGC 52 is shown in FIG. 4. The digital AGC 52 receives the I and Q signal outputs from the Nyquist filter 16. A gain value G from an AGC control module 60 is used to scale, in a multiplier 62, the I and Q signal components at twice per symbol to produce scaled I and Q signal components: Is and Qs, respectively. The scaled signal components Is and Qs are processed through the AGC control module 60 to estimate the signal level and produce the gain G. The Nyquist I and Q signal components, scaled by the gain value G to produce Is and Qs, are then processed by the phase detector module 12 as discussed above in conjunction with FIG. 2.

In summary, the AGC 52 amplifies the signal so that after the AGC 52 all signals (going through different channels, distortions etc.) have approximately the same level. This improves timing recovery by reducing the dynamic range of the maximum amplitude of the s-curves.

Figure 5:
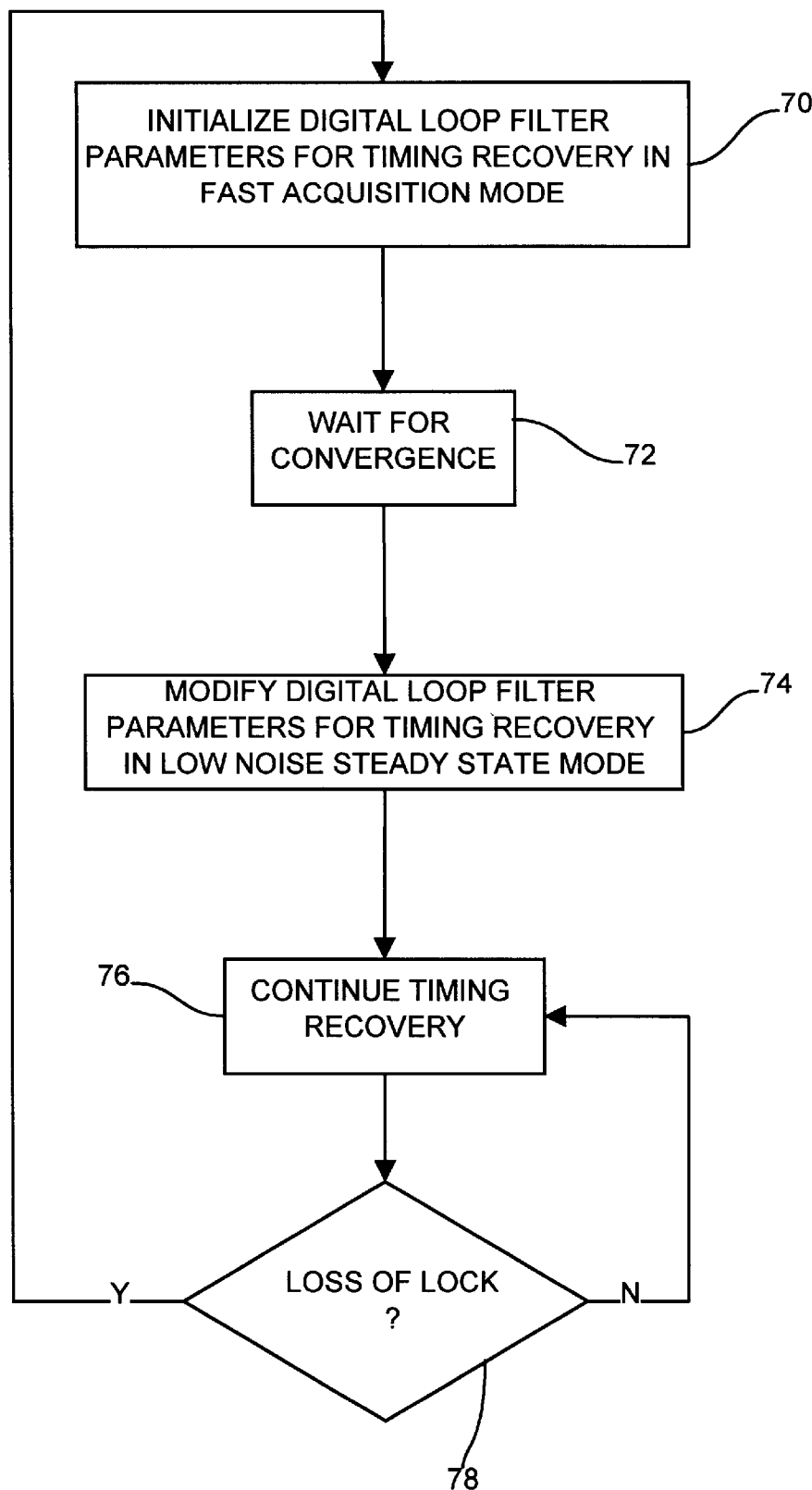
FIG. 5 illustrates a process of achieving fast acquisition and low phase jitter in steady state operation using timing recovery according to the present invention.

FIG. 5 illustrates an example of using the timing recovery loop circuit 10 during the process of achieving convergence and during steady state operation. At step 70, the pole parameters $k_1$ and $k_2$ of the digital loop filter 34 are initialized for timing recovery with fast acquisition. For example, the following values can be used for the parameters of the loop filter 20: $k_1$=10 (high gain) and $k_2$=8 (high frequency pole). Consequently, during this high speed acquisition function the phase jitter is high.

The receiver for the modem waits of convergence at step 72. A timing recovery convergence method is disclosed in Applicant's co-pending U.S. patent application titled "Method of Timing Recovery Convergence Monitoring in Modems" filed concurrently with the present application which has been assigned Ser. No. 09/076,634 and is hereby incorporated by reference.

After convergence, the timing recovery loop circuit 10 is setup for timing recovery, operating in low noise steady state mode at step 74. For example, the following values can be used for the parameters of the digital loop filter 34: $k_1$=12 (low gain) and $k_2$=10 (low frequency pole). This adjustment reduces phase jitter relative to the phase jitter during acquisition. The timing recovery loop circuit 10 continues to process signals at step 76. If a change in operating characteristics (i.e. loss of lock, large average phase error PEavg, etc.) is detected at step 78 processing returns to step 70 to reinitialize the process. If the receiver is still locked (PEavg remains near zero), then processing returns to step 76 for continued steady state timing recovery operation.

What is claimed is:

1. A receiver circuit having a means for receiving and sampling an analog input signal to generate a digital signal controlled by a voltage controlled oscillator supplying a timing signal, said receiver circuit comprising:

a digital matched filter for filtering the digital signal to generate an in-phase signal and a quadrature-phase signal;

a phase detector for generating an instantaneous phase error signal based on the in-phase and quadrature-phase signal;

a programmable digital loop filter that changes frequency pole and gain settings for signal acquisition and converged mode timing recovery functions by assigning a prescribed value to a gain parameter and a frequency pole parameter, waiting for timing lock, and modifying the parameters by increasing the prescribed value of the gain parameter and the prescribed value of the frequency pole parameter, the programmable digital loop filter averaging the instantaneous phase error signal for adjusting the timing signal supplied by the voltage controlled oscillator to the means for receiving and sampling the analog input signal.

2. The circuit of claim 1, wherein the average phase error signal from the programmable digital loop filter is processed through an analog loop filter for receiving and conditioning the average phase error signal from the digital loop filter.

3. The circuit of claim 2, wherein the analog loop filter is a first-order lead-lag filter.

4. The circuit of claim 1, wherein the phase detector includes a means for calculating a first phase error term from the in-phase signal and a means for calculating a second phase error term from the quadrature-phase signal.

5. The circuit of claim 4, wherein the means for calculating the first phase error term is characterized by:

$$\{r_i(T+T/2)-r_i(T-T/2)\} \times r_i(T)$$

where T represents a symbol period and $r_i$ represents complex in-phase data samples of the in-phase signals.

6. The circuit of claim 5, wherein the means for calculating the second phase error term is characterized by:

$$\{r_q(T+T/2)-r_q(T-T/2)\} \times r_q(T)$$

where $r_q$ represents complex quadrature received data samples of the quadrature-phase signal.

7. The circuit of claim 6, wherein the phase detector includes a means for adding the first phase error term with the second phase error term to obtain the instantaneous phase error signal.

8. A symbol timing recovery circuit, comprising:
   an voltage controlled oscillator for generating a timing signal as a function of an average phase error signal;
   an analog-to-digital converter for generating a digital signal from an input analog signal based on the timing signal;
   a digital matched filter for filtering the digital signal to generate an in-phase signal and a quadrature-phase signal;
   a phase detector circuit for generating an instantaneous phase error signal of the in-phase and quadrature-phase signals;
   a programmable digital loop filter that switches pole and gain settings from high frequency pole and high gain for signal acquisition to low frequency pole and low gain for converged mode by assigning a prescribed value to a gain parameter and a frequency pole parameter, waiting for timing lock, and modifying the parameters by increasing the prescribed value of the gain parameter and the prescribed value of the frequency pole parameter, the programmable digital loop filter receiving the instantaneous phase error signal over time to generate the average phase error signal;
   a digital-to-analog converter for converting the average phase error signal into an analog average phase error signal; and
   an analog loop filter for receiving and conditioning the analog average phase error signal, wherein the analog average phase error signal adjusts the timing signal generated by the oscillator.

9. The circuit of claim 8, wherein the phase detector circuit includes a means for calculating a first phase error term from the in-phase signal and a means for calculating a second phase error term from the quadrature-phase signal.

10. The circuit of claim 8, wherein the means for calculating the first phase error term is characterized by:

$$\{r_i(T+T/2)-r_i(T-T/2)\} \times r_i(T)$$

where T represents a symbol period and $r_i$ represents complex in-phase data samples of the in-phase signal.

11. The circuit of claim 10, wherein the means for calculating the second phase error term is characterized by:

$$\{r_q(T+T/2)-r_q(T-T/2)\} \times r_q(T)$$

where $r_q$ represents complex quadrature-phase received data samples of the quadrature-phase signal.

12. The circuit of claim 11, wherein the phase detector includes a means for adding the first phase error term with the second phase error term to obtain the instantaneous phase error signal.

13. The circuit of claim 12, wherein the analog loop filter is a first-order lead-lag filter.

14. The circuit of claim 13, wherein the voltage controlled oscillator operates at a nominal frequency that is adjusted by the average phase error signal.

15. The circuit of claim 13, wherein said analog-to digital converter includes an output for outputting the digital signal, an analog signal input for receiving the input analog signal, and a sampling frequency control signal input coupled to the output of the oscillator for receiving the timing signal and for controlling a rate at which the analog-to-digital converter samples the input analog signal.

16. The circuit of claim 15, wherein the digital matched filter includes an input coupled to the digital signal output of the analog-to-digital converter for receiving the digital signal, and a first output for outputting the in-phase signal and a second output for outputting the quadrature-phase signal.

17. The circuit of claim 8, further comprising an amplifier for receiving the in phase and quadrature-phase signals from the digital matched filter to amplify an input signal that is lower than a threshold.

18. The circuit of claim 17, wherein the amplifier includes a first input for receiving the in-phase signal and a second input for receiving the quadrature-phase signal and a control module for generating a gain value for scaling the in-phase and quadrature-phase signals.

19. A symbol timing recovery circuit, comprising:
   a voltage controlled oscillator for generating a sampling clock as a function of an average phase error signal, the oscillator having a nominal frequency and an output for outputting the sampling clock;
   an analog-to-digital converter for generating a digital signal from an input analog signal; said analog-to-digital converter having an output for outputting the digital signal, an input analog signal input for receiving the input analog signal, and a sampling frequency control signal input coupled to the output of the voltage controlled oscillator for receiving the timing signal and for controlling the rate at which the analog-to-digital converter samples the input analog signal;
   a digital matched filter for filtering the digital signal to generate an in-phase signal and a quadrature-phase signal; the digital matched filter including an input coupled to the digital signal output of the analog-to-digital converter for receiving the digital signal, and a first output for outputting the in-phase signal and a second output for outputting the quadrature-phase signal;
   a phase detector circuit for generating an instantaneous phase error signal of the in-phase and quadrature-phase signals;
   a programmable digital loop filter having adjustable pole and gain settings, said frequency pole and gain being set to high frequency pole and high gain for signal acquisition and switched to low frequency pole and low gain for converged mode by assigning a prescribed value to a gain parameter and a frequency pole parameter, waiting for timing lock, and modifying the parameters by increasing the prescribed value of the gain parameter and the prescribed value of the frequency pole parameter, the programmable digital loop filter receiving the instantaneous phase error signal over time to generate the average phase error signal;
   a digital-to-analog converter for converting the average phase error signal into an analog average phase error signal; and
   an analog loop filter for receiving and conditioning the analog average phase error signal, wherein the analog average phase error signal adjusts the nominal frequency of the oscillator to output the sampling clock.

20. A method of generating a symbol timing signal, used for timing recovery in a receiver, from an analog input signal, the method comprising the steps of:

operating a voltage controlled oscillator in response to an average phase error signal to generate a timing signal having a sampling frequency fs;

operating an analog-to digital converter to receive the analog signal, to receive the timing signal, and to generate a digital signal by sampling the analog signal at the sampling frequency fs;

filter the digital signal to generate an in-phase signal and a quadrature-phase signal;

using the in-phase signal to generate an in-phase error signal;

using the quadrature-phase signal to generate a quadrature-phase error signal;

summing the in-phase error signal and the quadrature-phase error signal to obtain an instantaneous phase error signal; and filtering the instantaneous phase error signal over a period of time to obtain the average phase error signal using a programmable digital loop filter that has a gain parameter and a frequency pole parameter each respectively assigned a value for signal acquisition mode operation, and an increased value for converged mode operation, and the programmable digital loop filter switches the parameters as the mode of operation changes.

21. A method of obtaining and maintaining timing lock in a modem receiver comprising steps:

a) initializing a digital loop filter having a gain parameter and a frequency pole parameter, where the gain parameter is assigned a prescribed value and the frequency pole parameter is assigned a prescribed value;

b) waiting for timing lock; and c) modifying the parameters of the digital loop filter by increasing the prescribed value of the gain parameter and by increasing the prescribed value of the frequency pole parameter.

22. The method of claim 21, wherein timing lock is obtained by filtering a digital signal to generate an in-phase signal and a quadrature-phase signal; using the in-phase signal to generate an in-phase error signal; using the quadrature phase signal to generate a quadrature-phase error signal; summing the in-phase error signal and the quadrature-phase error signal to obtain an instantaneous phase error signal; and filtering the instantaneous phase error signal through the digital loop filter to obtain an average phase error signal that adjusts a nominal frequency of an oscillator to output a sampling clock.

23. The method of claim 22, wherein timing lock is obtained when the average phase error signal is below a threshold.

24. The method of claim 23, wherein steps (a) to (c) are repeated when the average error signal exceeds the threshold.

* * * * *

UNITED STATES PATENT AND TRADEMARK OFFICE
CERTIFICATE OF CORRECTION

PATENT NO. : 6,278,746 B1
DATED : August 21, 2001
INVENTOR(S) : Edgar Velez et al.

It is certified that error appears in the above-identified patent and that said Letters Patent is hereby corrected as shown below:

<u>Title page,</u>
The Assignee is corrected to read -- Nortel Networks Limited --.

<u>Column 2,</u>
Line 10, "filtering means" is corrected to read -- a filtering means --.

<u>Column 4,</u>
Line 55, "represent" is corrected to read -- represents --.

<u>Column 5,</u>
Line 19, "controls loop gain" is corrected to read -- controls gain --.

<u>Column 6,</u>
Line 13, "The receiver for the modem waits of" is corrected to read -- The receiver of the modem waits for --.
Line 43, "signal" is corrected to read -- signals --.
Line 52, after "signal" the following is inserted -- over time to generate an average phase error signal --.

<u>Column 8,</u>
Line 18, "in phase" is corrected to read -- in-phase --.

<u>Column 9,</u>
Line 13, "filter" is corrected to read -- filtering --.

Signed and Sealed this

Twenty-eighth Day of May, 2002

*Attest:*

JAMES E. ROGAN
*Attesting Officer*    *Director of the United States Patent and Trademark Office*